(12) United States Patent
Gehring

(10) Patent No.: US 7,107,036 B1
(45) Date of Patent: Sep. 12, 2006

(54) DEMODULATOR ARCHITECTURE AND ASSOCIATED METHODS

(75) Inventor: Mark R. Gehring, Portland, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 546 days.

(21) Appl. No.: 10/295,662

(22) Filed: Nov. 15, 2002

Related U.S. Application Data

(63) Continuation of application No. 10/280,891, filed on Oct. 24, 2002, now abandoned.

(51) Int. Cl.
*H04B 1/16* (2006.01)

(52) U.S. Cl. .................... 455/334; 375/324; 329/317

(58) Field of Classification Search .............. 455/205, 455/208, 209, 313, 314, 315, 316, 323, 333, 455/334; 375/317, 324, 329, 344; 329/304, 329/306, 307, 308, 315, 317, 323, 327
See application file for complete search history.

(56) References Cited

U.S. PATENT DOCUMENTS

| 4,470,147 | A | * | 9/1984 | Goatcher | 329/317 |
| 5,870,669 | A | * | 2/1999 | Kawai | 455/209 |
| 6,127,884 | A | * | 10/2000 | Rishi | 329/304 |
| 6,236,847 | B1 | * | 5/2001 | Stikvoort | 455/313 |

* cited by examiner

*Primary Examiner*—Quochien B. Vuong
(74) *Attorney, Agent, or Firm*—Blakely, Sokoloff, Taylor & Zafman LLP

(57) ABSTRACT

Embodiments of a frequency modulated (FM) demodulator and associated methods are generally described. According to but one example embodiment, an apparatus is disclosed comprising a receiver front-end, to receive a signal from one or more antenna(e) and generate quadrature components of the received signal, and a frequency-shifted, cross-multiplied differentiator demodulator, coupled with the receiver front-end, to generate a demodulated representation of the received signal centered at a select intermediate frequency.

22 Claims, 6 Drawing Sheets

CONVENTIONAL DETECTOR ARCHITECTURE(S)

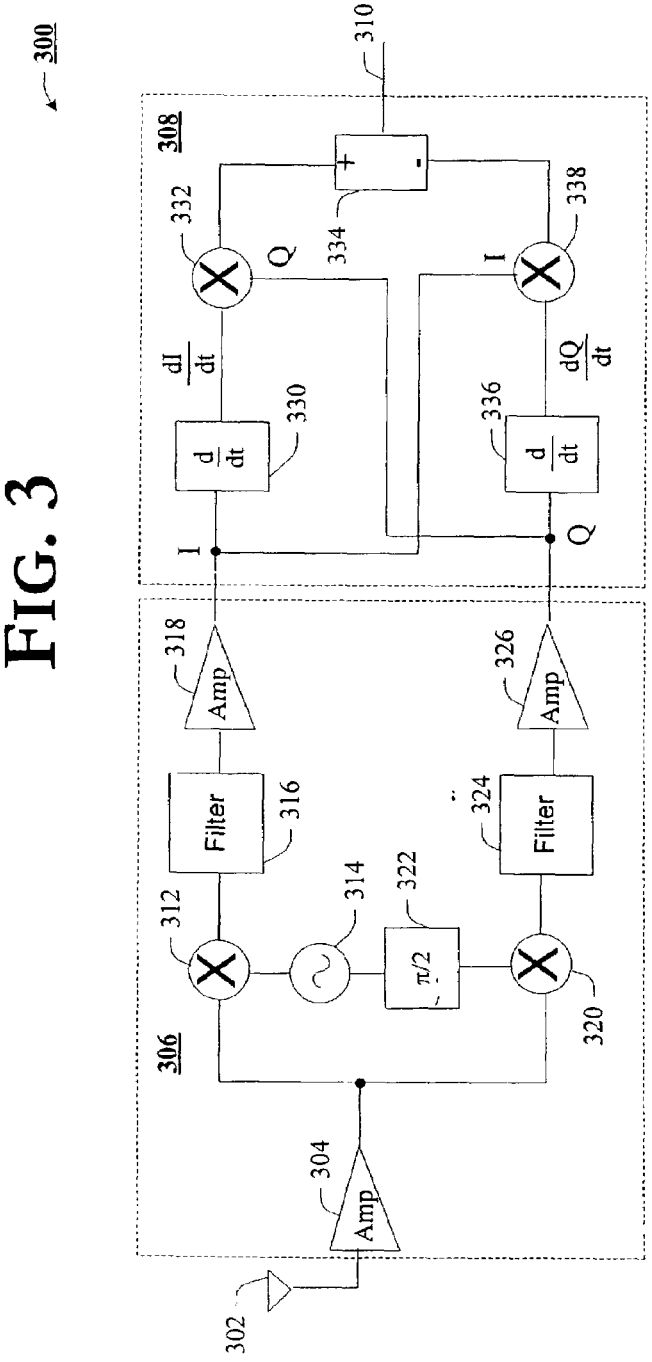
FIG. 3
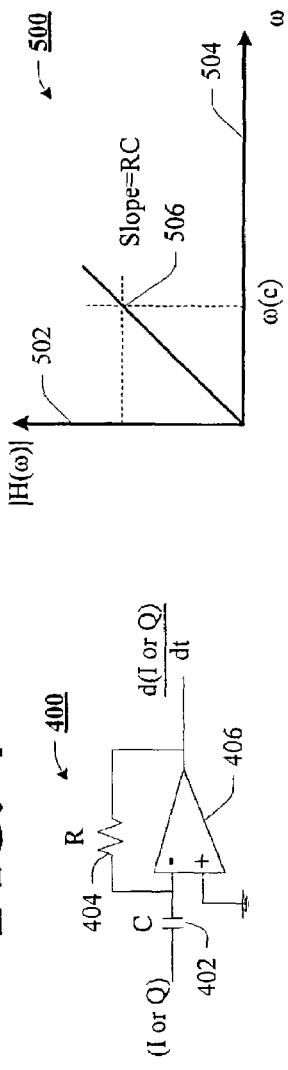
FIG. 5
FIG. 4

DEMODULATOR ARCHITECTURE AND ASSOCIATED METHODS

REFERENCE TO RELATED APPLICATION

This application is a continuation of U.S. patent application Ser. No. 10/280,891 entitled "A DEMODULATOR ARCHITECTURE AND ASSOCIATED METHODS," filed Oct. 24, 2002.

TECHNICAL FIELD

Embodiments of the invention generally relate to the field of receivers and, more particularly, to a receiver demodulator architecture and associated methods.

BACKGROUND

Wireless receivers typically have three fundamental elements: antenna(e), a receiver front-end, and a demodulator, as depicted in FIG. 1. The receiver front-end filters (108) and amplifies (110) the received signal, before mixing 112 the signal down to an intermediate frequency (IF) using a reference signal source (e.g., oscillator) 114. The resultant IF signal is further filtered (116) and amplified (118) before being passed to the demodulator 106.

As shown, the demodulator 106 is generally comprised of a detector (120), perhaps coupled with a reference signal source (122) to recover the transmitted content, which may be filtered (124) before further processing or rendering. Those skilled in the art will appreciate that the type of demodulator required for a given receiver architecture is dependent upon the type of modulation used in producing the received signal.

One such modulation technique is frequency modulation (FM). Frequency modulation (FM) is a method of imposing content (e.g., analog or digital information) on a carrier signal by varying the instantaneous frequency of the carrier signal based on such content. Thus, to recover the content imposed on the FM signal, a receiver uses an FM detector. Simplistically, an FM detector identifies the instantaneous changes in the frequency of the received signal, and translates such changes to produce a signal representative of the original content.

A number of conventional FM detector architectures are known which will recover a representation of the imposed content, sometimes referred to as the baseband signal, from the received FM carrier. Two well-known FM detector architectures, the discriminator and the phase-locked loop (PLL) are generally depicted with reference to FIG. 2.

With reference to element 200, an example discriminator architecture is depicted generally comprising a mixer 204 coupled with an oscillator network generally comprised of a resistor, inductive, capacitive (RLC) network 206 tuned to a desired intermediate frequency (IF). The discriminator uses an RLC network with a coupling capacitor to achieve a phase shift that is dependent on frequency. The RLC is tuned such that the nominal phase shift at the IF is ninety degrees. Deviation in frequency from the center (IF) produces an output from the phase shifter that is a small deviation from the 90 degrees, thus producing an output from the mixer (multiplier) that is proportional to the phase change and, as such, proportional to frequency deviation from IF.

Those skilled in the art will appreciate that, while the discriminator may work well in discrete applications, the inclusion of an inductor makes it extremely difficult to implement in silicon (i.e., in an integrated circuit (IC) package). While the inductor can be synthesized from a capacitor using an op-amp circuit or transconductance (gm/C) based gyrators, they must provide a high Q inductor to obtain reasonable outputs from the mixer, and must be wide enough to respond to the spectrum of the signal. Often, these are competing interests in the case of a low intermediate frequency, since the IF is only a few times larger than that of the modulation bandwidth and, as such, the percentage occupied by the bandwidth is quite large. This implies a low-Q network, which then may not produce enough signal at its output to be practical.

Element 220 depicts an example phase-locked loop (PLL) architecture, comprising a mixer 224 coupled with a signal source 226 feeding off of a filtered 228 feedback loop. The PLL attempts to track the incoming signal frequency by controlling the frequency of the signal source (voltage controlled oscillator (VCO)) 226. Thus, the control voltage on the VCO 226 is the demodulated signal, presuming that the bandwidth of the loop filter 228 is wide enough to pass the modulation frequencies.

Those skilled in the art will appreciate that the PLL 220 is a complex system that requires: significant engineering to conduct stability analysis; that the VCO be accurately designed with tight tolerances; and a wide bandwidth in the filter 228 to obtain low distortion. The wide filter can cause stability problems as well as allow spurious signals to pass to the output, which serves as the control input of the VCO. The VCO produces a signal at the IF which could corrupt the high-gain IF stages when implemented in silicon.

BRIEF DESCRIPTION OF THE DRAWINGS

Embodiments of the invention are illustrated by way of example, and not by way of limitation, in the figures of the accompanying drawings in which like reference numerals refer to similar elements and in which:

FIG. 3 is a block diagram of an example receiver architecture incorporating the teachings of the present invention.

FIG. 4 is a block diagram of an example differentiator detector, according to one embodiment of the present invention.

FIG. 5 is a graphical illustration of the frequency response of the example differentiator detector of FIG. 4.

FIG. 12 is a block diagram of an example storage medium including instructions which, when executed by an accessing machine, causes the machine to implement one or more aspects of an embodiment of the present invention.

DETAILED DESCRIPTION

Figure 1:
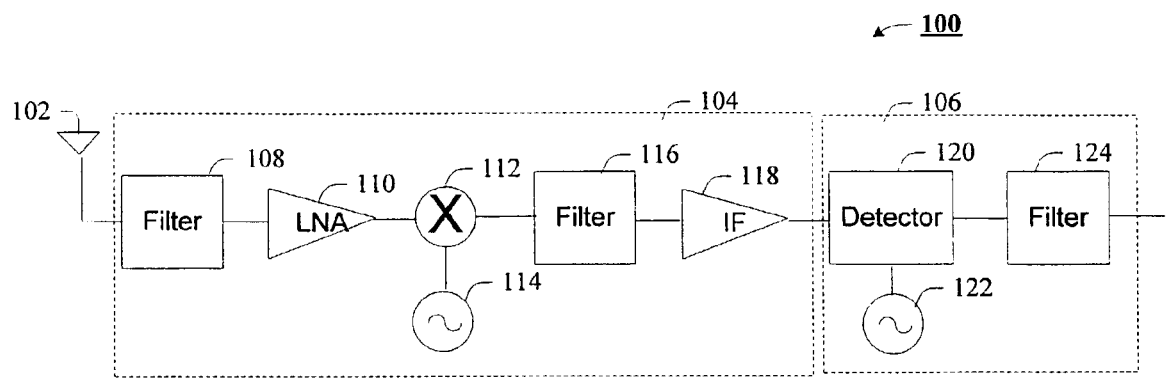
FIG. 1 is a block diagram of a conventional receiver of frequency modulated (FM) signals.
Figure 2:
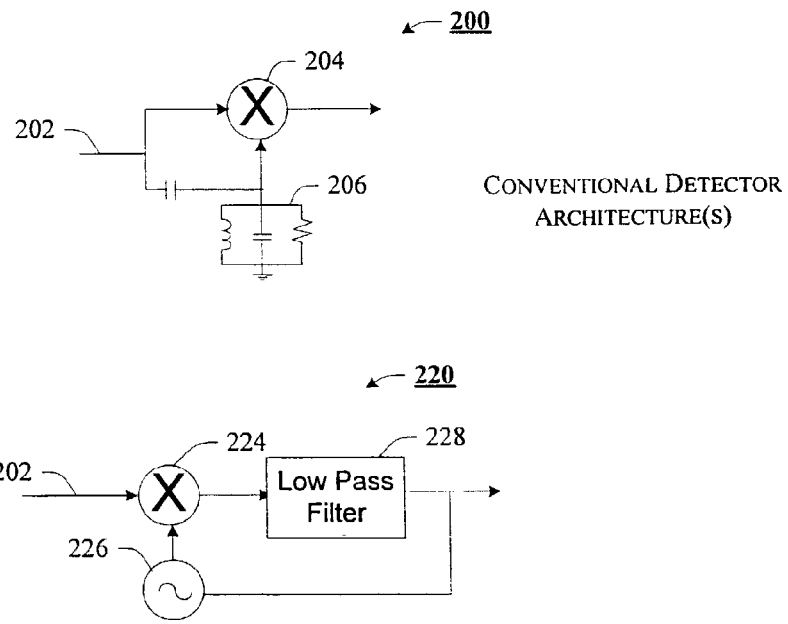
FIG. 2 is a block diagram of prior art FM detectors, representative of conventional detector architectures.

Embodiments of the invention are generally directed to a demodulator architecture and related methods. In this regard, according to one aspect of the invention, an FM detector architecture is disclosed including a frequency-shifted, cross-multiplied differentiator network to detect the instantaneous changes in frequency of a received carrier signal to separate a modulating signal (content of interest, or baseband signal) from the carrier, thereby demodulating the received signal.

In accordance with one aspect of the invention, a "frequency shifting network" is used within the innovative FM detector architecture to shift the center frequency, or "zero point" of the differentiator output to a select intermediate frequency (IF). In this way, the output of the differentiators denote the change in instantaneous frequency that deviate from the IF, i.e., the modulating signal of interest. It will be apparent from the discussion to follow that the detector architecture disclosed herein is well suited for implementation in an integrated circuit package, without the complex tuning or feedback provisions commonly associated with conventional detectors.

Appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Example Receiver Architecture

FIG. 3 provides a block diagram of a receiver incorporating the teachings of the invention, according to one example embodiment. In accordance with the illustrated example embodiment, receiver 300 is depicted comprising antenna(e) 302 coupled with a receiver front-end 306 and, in accordance with the teachings of the present invention, FM demodulator 308 including differentiator detector(s) (330, 336) to recover the desired content from a received FM carrier signal. It should be appreciated that, although depicted as a number of discrete elements, receiver 300 may well be implemented in silicon, that is, as an integrated circuit (IC) or an element thereof.

In accordance with the illustrated example embodiment of FIG. 3, receiver 300 is a quadrature receiver where the received signal is split in to multiple (e.g., two (2)) processing paths: an in-phase (I) processing branch and a quadrature (Q) processing branch. As shown, the receiver front-end (or, downconverter) 306 includes a receive amplifier which feeds the I and Q processing branches. Each branch of the receiver front-end 306 includes a mixer (312, 320) a filter (316, 324) and another amplifier stage (318, 326).

According to one example implementation, the receiver front-end uses a tuned clock source (e.g., voltage controlled oscillator) 314 to provide a reference signal to mixer 312, 320 to downconvert the received signal to a desired intermediate frequency (IF). According to one embodiment, the desired IF lies at or between baseband and the carrier frequency. It should be noted that the reference signal provided to mixer 320 in the Q branch is offset in phase from the reference signal provided to the I branch by ninety degrees (90°, or π/2). In each of the I and Q branch of the receiver 300, the downconverted signal (I, or Q) is filtered 316, 324 and amplified 318, 326 for delivery to the demodulator stage 308.

In accordance with the teachings of the present invention, demodulator 308 is comprised of an I and Q branch, each comprising a differentiator (330, 336) and a mixer (332, 338) coupled with a summing element 334 which, in accordance with the illustrated example implementation, obtains the difference between the processing performed along the I branch and the Q branch. As will be developed more fully below, passing the IF I and Q signals through differentiators 330 and 336, respectively, generates a signal directly correlated with the rate of change of the phase (or, in other words, the instantaneous frequency) of the received (IF) signal. In this regard, the differentiators 330, 336 function as FM detectors, generating a signal correlated to the modulating signal of the received FM signal.

The differentiator output is applied to mixers 332, 338, which mix (e.g., multiply) the differentials generated in each branch with the IF signal from the other branch. Stated another way, the differentials are multiplied with a phase-shifted representation of the IF signal. The output of the mixers 332, 338 are passed to a summing module 334, which subtracts the complex Q signal from the complex I signal to produce the baseband signal at point 310.

Example Differentiator Architecture(s)

Turning to FIG. 4, a circuit diagram of an example differentiator architecture 400, suitable for use in demodulator 308 is presented in accordance with one example embodiment of the present invention. According to one example implementation, example differentiator architecture 400 may well be used as differentiator 330 and/or 336 in demodulator 308.

In accordance with the illustrated example embodiment of FIG. 4, a differentiator circuit 400 is presented comprising an input (i.e., the IF I or Q signal) received at the negative (or, inverting) input of an operation amplifier (op-amp) 406 through a capacitor 402. The output of the op-amp 406 is coupled, through a resistor 404, to the filtered input signal (i.e., between capacitor 402 and the negative input of the op-amp 406).

The output of the differentiator is proportional to the time derivative of the input (I or Q), and may be expressed mathematically as:

$$Vo = RCd(v(I)/dt) \text{ or, } Vo = RCd(v(Q)/dt) \qquad [1]$$

Accordingly, if the input signal is a sine wave (e.g., sin ωt), where ω is the frequency of the signal, the result of a differentiator in the I branch (for example) will be:

$$v_o = RC\omega \cos \omega t \qquad [2]$$

That is, the magnitude of the output increases linearly with increasing frequency, as the differentiator functions as a type of frequency-to-amplitude converter. An example of the output characteristics of differentiator 400 is illustrated with reference to FIG. 5.

FIG. 5 is a graphical illustration of the frequency response of the example differentiator detector of FIG. 4. The graph 500 depicts increasing amplitude along the y-axis 502, over increasing frequency along the x-axis 504. As shown, the slope of the resultant output 506 of the differentiator 400 increases linearly over increasing frequency (ω) of the input. The slope of the resultant output (i.e., the gain of the differentiator 400) is determined by the values chosen for resistor 404 and capacitor 402 elements of the differentiator network 400.

One limitation of differentiator 400 arises from its tendency to emphasize high frequencies, i.e., exhibit increasing gain characteristics at higher frequencies. Thus, when applied to the task of FM detector, the differentiator will exhibit a large DC offset at the selected IF, ω(c), as denoted in FIG. 5. This DC offset may well be equivalent to several times the peak value of the modulating signal.

To remove this undesirable DC offset, a frequency shifting network is introduced that effectively "shifts" the center frequency, or zero point, of the differentiator to a desired frequency (e.g., the IF frequency), in accordance with one aspect of the present invention. Accordingly, the output of the frequency-shifted, cross-multiplied differentiator detector network will be zero when a carrier at the frequency is present, and will deviate from zero (positive or negative) as the instantaneous frequency deviates above or below the carrier frequency, respectively. An example of a frequency-shifted, cross-multiplied differentiator detector architecture is presented with reference to FIG. 6.

Figures 6, 7:
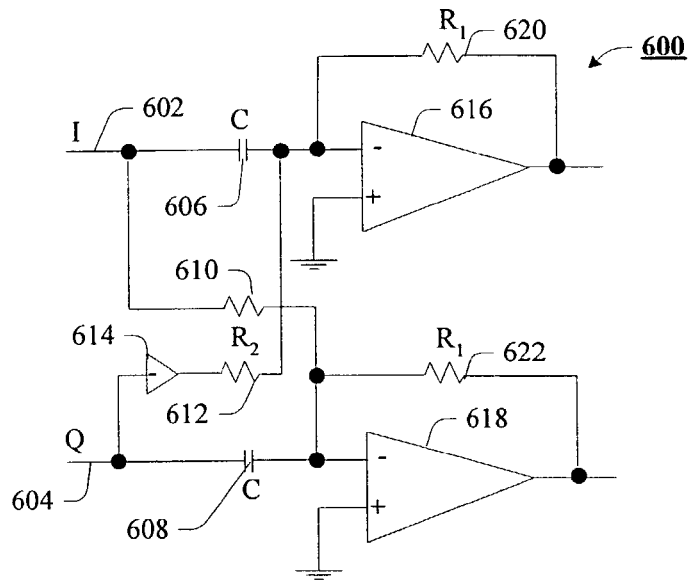
FIG. 6 is a circuit diagram of an example frequency-shifted differentiator detector, according to another embodiment of the present invention.
FIG. 7 is a graphical illustration of the frequency response of the differentiator detector of FIG. 6.

FIG. 6 is a circuit diagram of an example frequency-shifted, cross multiplied differentiator detector according to one embodiment of the present invention. In accordance with the illustrated example implementation of FIG. 6, differentiator network 600 is presented comprising differentiator architecture of FIG. 4 (e.g., capacitors 606, 608, op-amps 616, 618 and feedback resistors 620, 622), supplemented with a resistor network $R_2$ 610, 612, each coupled as depicted. It will be appreciated that the resistor-capacitor network of resistors 610, 612 and capacitors 606, 608, control the center frequency, or zero point, of the differentiator(s).

As depicted, the frequency shifting network effectively couples the input of one branch (I 602 or Q 604) of the demodulator with the inverting (negative) input of the op-amp 616, 618 in the alternate branch. In addition, an inverter element 614 is introduced before the resistor 612 coupling the Q IF input 604 with the inverting input of the op-amp 616 in the I-branch. As indicated above, the selection of $R_2$ 610, 612 and C 606, 608 in the detector architecture 600 determine the zero point of the differentiator. Accordingly, careful selection of the resistors 610, 612 and the capacitors 606, 608 will establish a zero point at the select IF in accordance with the following:

$$\omega(c) = 1/R_2 C \quad [3]$$

As above, selection of resistors ($R_1$) 620, 622 in combination with capacitors 606, 608 determine the slope (or, gain) of the differentiators response, i.e., in accordance with:

$$\text{Slope} = R_1 C \quad [4]$$

Each of the foregoing is illustrated graphically with reference to FIG. 7.

FIG. 7 is a graphical illustration of the frequency response of the differentiator detector of FIG. 6. As with FIG. 5, the y-axis 502 depicts an amplitude as a function of frequency ω, comprising the x-axis 504. Unlike the differentiator response of FIG. 5, the frequency shifted detector 600 is centered (i.e., the zero point resides at) the selected intermediate frequency ω(c), with the slope on either side denoting frequency deviations (positive or negative) therefrom.

Figure 8:
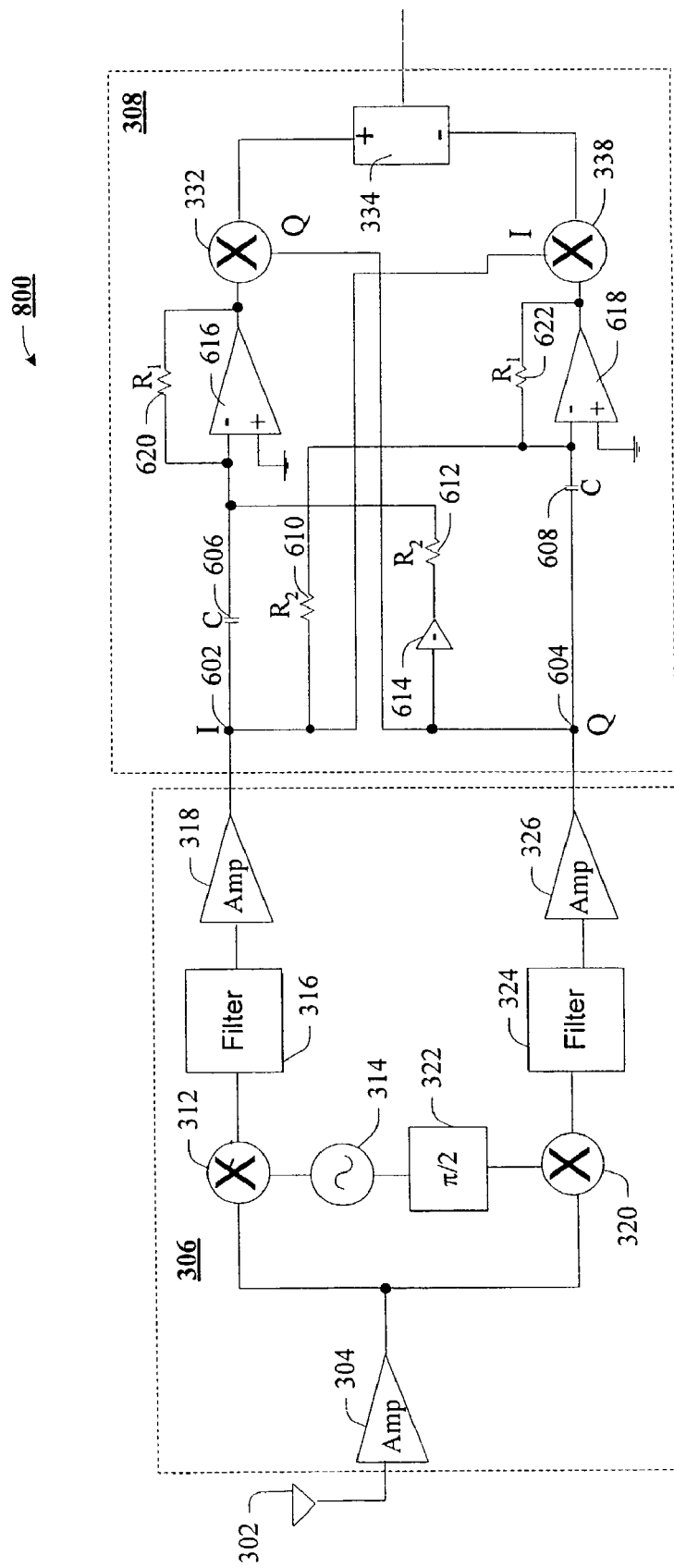
FIG. 8 is a block diagram of an example receiver providing a circuit diagram of the differentiator detector, according to one example embodiment of the invention.

FIG. 8 is a block diagram of the receiver of FIG. 3 incorporating the frequency shifted, differentiator detector, in accordance with one example implementation of the invention. In accordance with the illustrated example implementation of FIG. 8, receiver 800 is depicted comprising receive antenna(e) 302, receiver front-end 306, and a demodulator stage 308 including the frequency shifted, differentiator detector architecture 600 coupled with mixers 332, 338 and summing module 334, each coupled as depicted.

In view of the foregoing, for purposes of completing the mathematical analysis of the processing along each of the I and the Q branches of the receiver architecture 800, the detector network generates a frequency shifted differential of the IF I (602) and Q (604) signals, respectively, which is then mixed (332, 338) with a phase shifted representation of the IF signal from the alternate branch. As such, the function implemented in the summing module 314 of receiver 800 represented mathematically is:

$$\text{demod} = \left( Q \frac{dI}{dt} - I \frac{dQ}{dt} \right) \quad [5]$$

which resolves to reveal the modulating signal of the received FM carrier at output 310.

Example Operation

Having introduced an example architecture and operating environment, a method for recovering baseband information from a receive FM signal is described with reference to FIG. 9, in accordance with one example embodiment of the present invention. For ease of illustration, and not limitation, the operation of a receiver incorporating the teachings of the present invention will be developed with continued reference to the receiver architecture of FIG. 8. It should be appreciated, however, that alternate receiver architectures which employ a differentiator detector are anticipated within the spirit and scope of the present invention.

Figure 9:
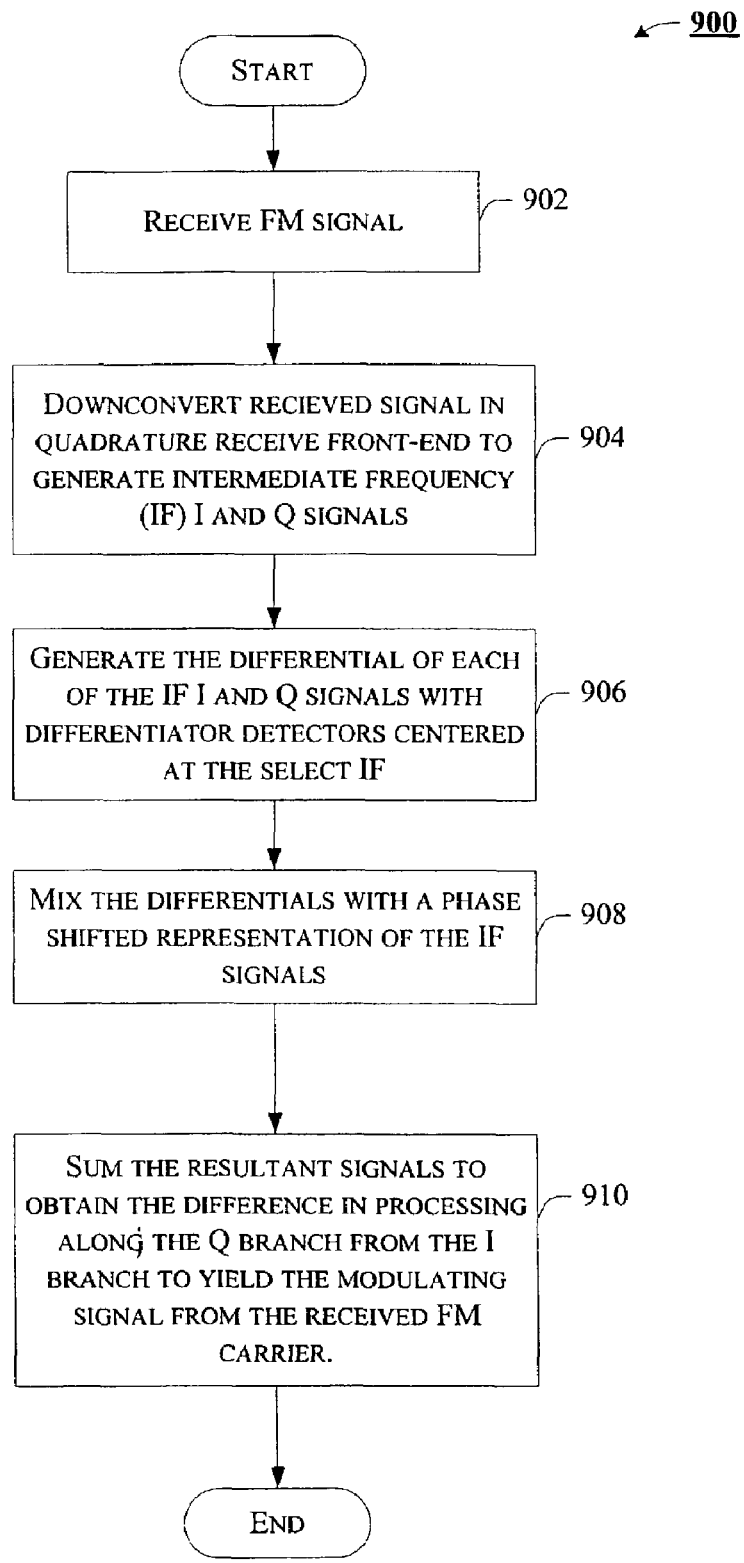
FIG. 9 is a flow chart of an example method of down-converting an FM signal, according to one example embodiment of the invention.

FIG. 9 is a flow chart of an example method of operation of a receiver incorporating a differentiator detector, according to one example embodiment of the invention. In accordance with illustrated example embodiment of FIG. 9, the method begins with block 902 wherein receiver 800 receives an FM signal impinging on antenna(e) 302.

In block 904, the received signal are downconverted to an intermediate frequency (IF) representation of the received signal. As discussed above, receiver 800 is a quadrature receiver and, as such, the received signal is split for processing along an in-phase (I) and quadrature (Q) processing branch. In each branch, the received signal is downconverted to a select IF by mixing the received signal with a reference signal. The reference signal applied to the signal in the Q branch is ninety degrees out of phase with the reference signal applied to the received signal in the I branch. Accordingly, the output of block 904 is an in-phase (I) and quadrature (Q) representation of the received signal mixed down to a select IF.

In block 906, the IF I and Q representation of the received signals are each processed by a differentiator detector to generate the differential of each of the I and Q signals. More specifically, in accordance with one example embodiment, the I and Q signals are processed through a frequency shifting, differentiator detector network (600) to obtain a time-derivative of the IF signal(s) to recover the instantaneous frequency deviations from the IF. As discussed above, the center frequency, or zero point of the frequency shifting, differentiator detector network is controlled by selecting $R_2$ of resistors 610, 612 and C of capacitors 606, 608, which serve to shift the zero of the differentiator to a frequency associated with the selected IF.

In block 908, the differentials generated by the frequency shifting, differentiator detectors are mixed (multiplied) with the IF signal from the other (alternate) branch. That is, the differential in the I branch (i.e., result of op-amp 616) is multiplied with the Q IF signal 604 at mixer 332. Similarly, the differential in the Q branch (i.e., the result of op-amp 618) is multiplied with the I IF signal 602 at mixer 338.

In block 910, the result of the multiplier stages 332, 338 is passed to a summing module 334 which subtracts the result of processing along the Q branch of the receiver from the result of processing along the I branch of the receiver to yield the modulating signal from the received FM carrier.

Alternate Differentiator Implementations

Those skilled in the art, based on the foregoing, may well recognize that certain functions of, in particular, the frequency shifting network may well be implemented using alternate devices. Such alternate implementations are anticipated within the scope and spirit of the present invention, as detailed with reference to FIGS. 10 and 11, below.

Figure 10:
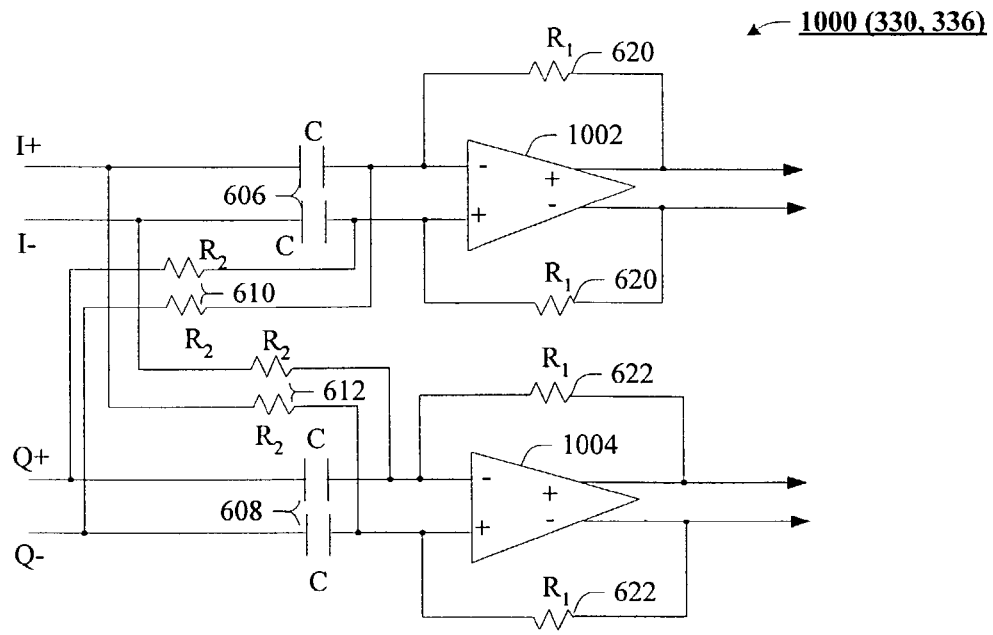
FIG. 10 is a circuit diagram of an alternate implementation of the differentiator detector, according to one embodiment of the invention.

FIG. 10 is a circuit diagram of an alternate implementation of the differentiator detector, according to one embodiment of the invention. In accordance with the illustrated example embodiment of FIG. 10, a frequency shifting, differentiator detector network 1000 is presented using differential operational amplifiers 1002, 1004 in each of the I and Q branches, respectively. It will be appreciated that, using differential op-amps 1002, 1004 requires that the frequency shifting RC network of resistors 610, 612 and capacitors 606, 608 be doubled for each of the inverting and non-inverting inputs of the differential op-amps 1002, 1004. While the number of resistors/capacitors is increased with such an implementation, the use of the differential op-amps 1002, 1004 eliminates the need for gain=−1 amplifier as in the single-ended case.

Figure 11:
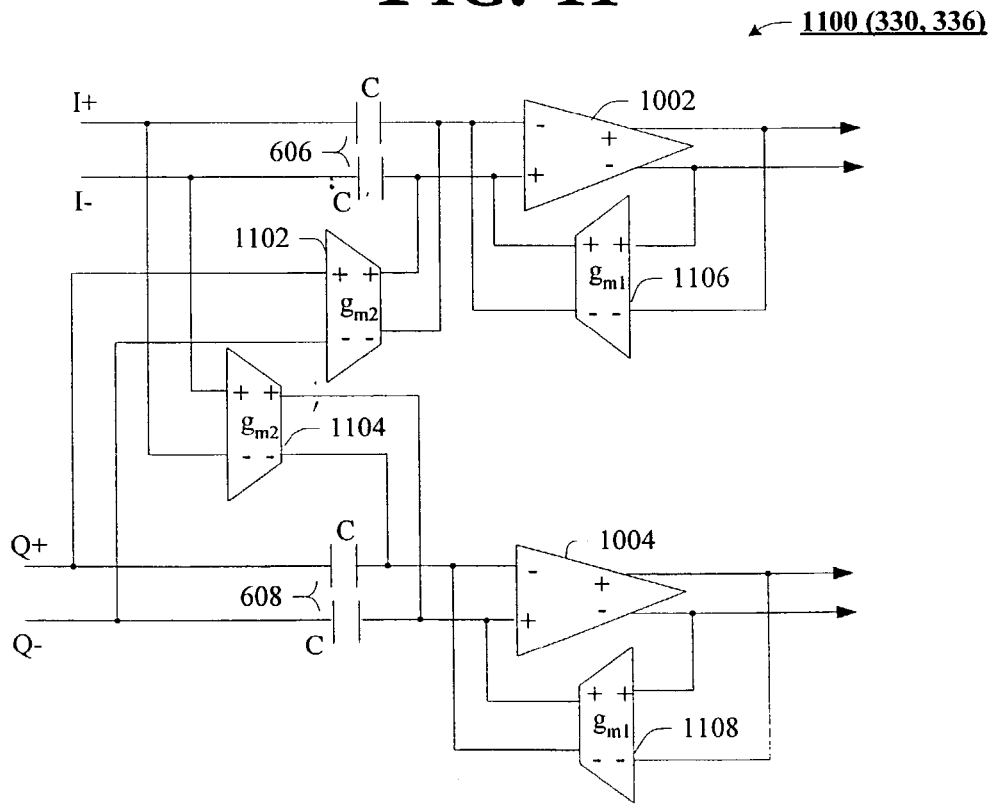
FIG. 11 is a circuit diagram of an alternate implementation of the differentiator detector, according to one embodiment of the invention.

FIG. 11 is a circuit diagram of an alternate implementation of the differentiator detector, according to one embodiment of the invention. In accordance with the illustrated example embodiment of FIG. 11, the differential operational amplifiers 1002, 1004 are again used. Rather than the resistor/capacitor frequency shifting network of FIGS. 6 and 10, a transconductor/capacitor implementation is disclosed in FIG. 11. As shown, transconductance elements 1102, 1104 replace resistors 610, 612, while elements 1106, 1108 replace resistors 620, 622. Accordingly, transconductance elements 1102, 1104 in combination with capacitor 606, 608 control the center frequency (zero point) of the differentiator, while elements 1106, 1108 in combination with capacitor 606, 608 control the gain (slope) of the differentiator response.

It should be appreciated that, although not particularly depicted, combinations of the frequency shifting, differentiator detector networks of FIGS. 10 and 11 may well be used in accordance with the teachings of the present invention. That is, in accordance with one example embodiment, the center frequency of such a network may well be set using a transconductance/capacitor network (e.g., elements 1102, 1104 with capacitors 606, 608), while the gain (slope) of the response of the differentiator is controlled with a resistor/capacitor network (e.g., resistors 620, 622 with capacitors 606, 608). In an alternate implementation, the center frequency of the differentiator is controlled with a resistor/capacitor network, while the gain is controlled with a transconductance/capacitor network.

FIG. 12 is a block diagram of a storage medium having stored thereon a plurality of instructions which, when executed by an accessing machine, cause the machine to implement an embodiment of the frequency shifting, differentiator detector network 600, according to one example embodiment of the invention. As used herein, such instructions, or content, may well be comprised of computer-executable instructions to implement the features of the frequency shifting, differentiator detector 600 in software. In an alternate implementation, the instructions control manufacturing equipment to produce an integrated circuit (IC) implementation of the frequency shifting, differentiator detector network 600.

As used herein, machine accessible medium 1200 is intended to represent any of a number of storage media known to those skilled in the art such as, for example, volatile memory devices, non-volatile memory devices, magnetic storage media, optical storage media, propagated signals and the like. Similarly, the executable instructions are intended to reflect any of a number of software languages known in the art such as, for example, C, C++, Visual Basic, Markup Languages (e.g., HTML, XML, etc.), Java, languages understood by logic design and layout tools and/or circuit design and layout tools such as, e.g., Very High Speed Integrated Circuit (VHSIC) Description Language, or VHDL, Verilog, SPICE netlist or a standard cell design language, and/or languages understood by IC manufacturing equipment.

It is to be appreciated that the medium 1200 need not be co-located with any host system. That is, medium 1200 may well reside within a remote server communicatively coupled to and accessible by an executing system. Accordingly, the software implementation of FIG. 12 is to be regarded as illustrative, as alternate storage media and software embodiments are anticipated within the spirit and scope of the present invention.

Although the invention has been described in the detailed description as well as in the Abstract in language specific to structural features and/or methodological steps, it is to be understood that the invention defined in the appended claims is not necessarily limited to the specific features or steps described. Rather, the specific features and steps are merely disclosed as exemplary forms of implementing the claimed invention. It will, however, be evident that various modifications and changes may be made thereto without departing from the broader spirit and scope of the present invention. The present specification and figures are accordingly to be regarded as illustrative rather than restrictive. The description and abstract are not intended to be exhaustive or to limit the present invention to the precise forms disclosed.

The terms used in the following claims should not be construed to limit the invention to the specific embodiments disclosed in the specification. Rather, the scope of the invention is to be determined entirely by the following claims, which are to be construed in accordance with the established doctrines of claim interpretation.

What is claimed is:

1. An apparatus comprising:
   a receiver front-end, to receive a signal from one or more antenna and generate quadrature components of the received signal; and
   a frequency-shifted, cross-multiplied differentiator demodulator having a non-zero center frequency, coupled with the receiver front-end, to generate a demodulated representation of the received signal centered at a select intermediate frequency.

2. An apparatus according to claim 1, the demodulator comprising:
   two parallel processing paths, one each for an in-phase and quadrature representation of the received signal, each path including,
   a differentiator, to generate a differential of the in-phase or quadrature component of the received signal, respectively; and
   a mixer, coupled with the differentiator, to mix the in-phase or quadrature component of the received signal with the quadrature or in-phase representation of the received signal, respectively.

3. An apparatus according to claim 1, the receiver front-end comprising:
one or more antenna, to receive wireless signals; and
a quadrature downconverter, to generate an in-phase representation of the received signals and a quadrature representation of the received signals at a select intermediate frequency (IF).

4. An apparatus according to claim 3, the quadrature downconverter comprising:
two processing paths, one each coupled to the one or more antenna, each processing path including,
a mixer, coupled to the antenna, to mix the received signal with a reference signal to downconvert the received signal to the select intermediate frequency, wherein the reference signal applied to the quadrature representation of the received signal is phase shifted from that applied to the in-phase representation of the received signal.

5. An apparatus according to claim 4, each path of the quadrature downconverter further comprising:
a filter element, to filter out unwanted signal elements from the downconverted signal; and
an amplifier element, to increase a signal strength of the downconverted signal prior to demodulation of the signal.

6. An apparatus according to claim 1, wherein the select intermediate frequency lies between a baseband and a carrier frequency of the received signal.

7. An apparatus according to claim 1, wherein the select intermediate frequency is a baseband frequency.

8. An apparatus according to claim 1, wherein the apparatus is implemented within a single integrated circuit (IC).

9. A wireless communication device comprising:
one or more antenna; and
an apparatus according to claim 1.

10. An apparatus, comprising:
a receiver front-end, to receive a signal from one or more antenna and generate quadrature components of the received signal; and
a frequency-shifted, cross-multiplied differentiator demodulator, coupled with the receiver front-end, to generate a demodulated representation of the received signal centered at a select intermediate frequency, the demodulator comprising:
two parallel processing circuits, one each for an in-phase and quadrature representation of the received signal, each circuit including,
a differentiator to generate a differential of the in-phase or quadrature component of the received signal, respectively,
a mixer coupled to the differentiator to mix the in-phase or quadrature component of the received signal with the quadrature or in-phase representation of the received signal, respectively, and
a frequency shifting network coupled to the differentiator, the frequency shifting network comprising passive electronic elements, wherein values of the passive electronic elements are associated with a crossing point of the differentiator.

11. An apparatus according to claim 10, wherein the passive electronic elements comprise:
a resistor-capacitor filter element having one or more resistors and one or more capacitors.

12. An apparatus according to claim 10, the demodulator further comprising:
a summing module, coupled with each of the two parallel processing circuits, to subtract a result of the in-phase processing circuit from a result of the quadrature processing circuit.

13. A method comprising:
receiving a frequency modulated (FM) signal; and
generating a frequency shifted differential of each of an in-phase and quadrature representation of the received FM signal which, when selectively combined, reveals a modulating signal of the received FM signal, wherein generating the frequency shifted differential of each of the in-phase and quadrature representation of the received FM signal comprises shifting a center frequency of a differentiator generating the differential to a select non-zero intermediate frequency (IF).

14. A method according to claim 13, the method further comprising:
splitting the received signal into two processing branches, an in-phase branch and a quadrature branch; and
mixing the signal in the in-phase branch with a reference signal, and the signal in the quadrature branch with a phase-shifted representation of the reference signal.

15. A method according to claim 14, wherein the reference signal is associated with the select IF.

16. A method according to claim 13, wherein generating the frequency shifted differential further comprises:
computing a differential of each of the in-phase and quadrature representation of the received FM signal; and
multiplying the computed differential of the in-phase and quadrature representation of the received FM signal with the quadrature and in-phase representation of the received FM signal, respectively.

17. A method according to claim 16, further comprising:
subtracting a product of the quadrature differential from a product of the in-phase differential to produce a demodulated representation of the received FM signal.

18. A storage medium comprising content which, when executed, causes an accessing machine to implement a method according to claim 13.

19. An apparatus comprising:
a differentiator to generate a differential of a component of a received signal; and
a frequency shifting network coupled to the differentiator, the frequency shifting network comprising one or more passive electronic elements, wherein values of the one or more passive electronic elements are associated with a crossing point of the differentiator and a second differentiator of a processing circuit.

20. The apparatus of claim 19, wherein the one or more passive electronic elements comprise a resistor-capacitor filter element.

21. The apparatus of claim 19, wherein the processing circuit is a quadrature processing circuit.

22. The apparatus of claim 21, further comprising:
a mixer coupled to the differentiator to mix the component of the received signal with a quadrature component of the received signal from the quadrature processing circuit, wherein the component of the received signal comprises an in-phase component of the received signal.

* * * * *